United States Patent
Wang et al.

(10) Patent No.: US 7,176,746 B1
(45) Date of Patent: Feb. 13, 2007

(54) LOW POWER CHARGE PUMP METHOD AND APPARATUS

(75) Inventors: Lei Wang, Cupertino, CA (US); Jianbin Wu, Fremont, CA (US)

(73) Assignee: PicoNetics, Inc., Fremont, CA (US)

( * ) Notice: Subject to any disclaimer, the term of this patent is extended or adjusted under 35 U.S.C. 154(b) by 0 days.

(21) Appl. No.: 10/294,042

(22) Filed: Nov. 12, 2002

Related U.S. Application Data

(63) Continuation-in-part of application No. 09/967,189, filed on Sep. 27, 2001, now Pat. No. 6,559,681.

(51) Int. Cl.
*G05F 1/10* (2006.01)

(52) U.S. Cl. ............... 327/536; 327/534; 327/537; 326/113

(58) Field of Classification Search ........... 327/536, 327/534, 537, 530, 535; 326/113
See application file for complete search history.

(56) References Cited

U.S. PATENT DOCUMENTS

| | | | | |
|---|---|---|---|---|
| 5,982,223 A | * | 11/1999 | Park et al. | 327/536 |
| 6,198,342 B1 | * | 3/2001 | Kawai | 327/536 |
| 6,661,278 B1 | * | 12/2003 | Gilliland | 327/536 |

* cited by examiner

*Primary Examiner*—Vibol Tan
(74) *Attorney, Agent, or Firm*—Anthony B. Diepenbrock, III; Dechert LLP

(57) ABSTRACT

A low power charge pump system having a plurality of charge pump cells. Each cell is a three transistor device that operates to transfer voltage from an input node to an output node of the cell when the input voltage is substantially greater than the output voltage and to block when the output voltage is substantially greater than the input voltage. Each cell has a pump capacitor is connected between a clock and its output, the odd-numbered cells having a first clock connected to their pump capacitors and the even-numbered cells having a second clock connected to their pump capacitors. During a first phase of either the first or second clock, the cell operates to transfer a voltage on its input node to its output node and during a second phase, the cell operates to boost its output voltage by a predetermined amount.

12 Claims, 7 Drawing Sheets

LOW POWER CHARGE PUMP METHOD AND APPARATUS

CROSS-REFERENCE TO RELATED APPLICATIONS

The application is a continuation-in-part of Ser. No. 09/967,189, filed Sep. 27, 2001 U.S. Pat. No. 6,559,681, issued May 6, 2003, entitled "RESONANT LOGIC AND THE IMPLEMENTATION OF LOW POWER DIGITAL INTEGRATED CIRCUITS", which patent is incorporated by reference into the present application.

FIELD OF THE INVENTION

This invention relates generally to charge pumps, and in particular, to low power charge pumps using resonant power circuitry.

DESCRIPTION OF THE RELATED ART

Charge pumps are commonly used to generate or boost a voltage beyond the range of the power supply in the system. These devices are often used in flash memory or EEPROM. FIG. 1 shows a prior art charge pump 10 employing diodes 12, 14, 16 and two clocks CLK1 20, CLK2 22. Included in the charge pump are a number of stages 32, 34, 36 each of which includes a diode 12, 14, 16 (or diode connected transistor), which is used as the charge transfer device, and a capacitor 24, 26, 28 which is used as charge holding device. One side of the diode in each stage is connected to an input voltage and the other side is connected to the capacitor of the stage. The other side of the capacitor 24, 26, 28 is connected to a clock input 20, 22. The input of the diode in the first stage is connected to the power supply, $V_{dd}$, that is to be boosted. The output of the diode 16 in the last stage is the boosted voltage, which may be connected to a storage capacitor 40 via a diode 18. Preferably, the clock inputs to adjacent stages are non-overlapping to prevent charge from moving backward and decreasing efficiency.

In operation, while the clock 20 to the capacitor 24 of the first stage 32 is low, charge is transferred through the first stage diode 12 from the power supply Vdd to the first stage capacitor 24. Thus, the capacitor 24 is charged so as to have a voltage, $V_{dd}-V_f$, across it, where $V_{dd}$ is the supply voltage and $V_f$ is the voltage drop across the diode 12. While the first stage capacitor 24 is charging to $V_{dd}-V_f$, the next succeeding stage 34 has its clock 22 in its high state to prevent the charging of the first stage 32 from leaking into the second stage capacitor 26, because the second stage diode 14 is back-biased.

When the clock 20 to the first stage 32 changes to its high state and the second stage clock 22 changes to its low state, the voltage on the first stage capacitor 24 is now, $V_{dd}-V_f+V_{dd}$ and the second stage capacitor 26 is now charged to $V_{dd}-V_f+V_{dd}$. When the second stage clock 22 changes to $V_{dd}$, the voltage on the second stage capacitor 26 becomes $V_{out}=(V_{dd}-V_f)2+V_{dd}$. Every succeeding stage adds a new voltage of $V_{dd}-V_f$ to the preceding stage voltage. Thus, after N stages the final voltage $V_{out}=(V_{dd}-V_f)\cdot N+V_{dd}$. As is apparent from the formula, to obtain a specified increase in voltage, an additional number of stages may need to be employed to overcome the Vf loss at each stage than if there were no $V_f$ loss at each stage. For example, if $V_f$ is 0.5 volt, after two stages an entire volt is lost that otherwise could have been generated. This requires an additional stage of boost to recover the one volt loss. Therefore, the above described circuitry is inefficient.

To improve the efficiency of the above circuitry, the circuitry of FIG. 2A may be used. The circuitry 50 of FIG. 2A shows a charge pump in which the $V_f$ drop of the charge transfer device is substantially reduced. Two stages 52, 54 of the charge pump are shown in the figure. Stage 52 includes three transistors M2 56, M1 58, M3 60, two capacitors C1 68, C2 70 and two clock inputs CLK1 76, CLK2_a 78. Stage 54 includes three transistors M1 62, M2 64, M3 66, two capacitors C1 72 and C2 74 and two clock inputs CLK2 80, CLK1_a 82. Stage 54 has an input node 84 and an output node 86. A first transistor M1 of each stage is the charge transfer device, the second transistor M2 is configured for Vt cancellation and the third transistor M3 is used for initialization. A first capacitor C1 is the charge-pump holding capacitor. A second capacitor C2 is a Vt cancellation capacitor for use in conjunction with the second transistor M2.

The channel of the first transistor M1 of each stage connects between the input node and the output node of the stage, the output node being the node at which the boosted voltage is present The gate of the first transistor M1 connects to one side of the second capacitor C2 and a "transfer clock," CLK1_a or CLK2_a, connects to the other side of the second capacitor C2. The channel of the second transistor M2 of each stage connects between the gate of the first transistor M1 and the input node of the stage. The gate of the second transistor M2 connects to one side of the first capacitor C1 and a "boost clock," CLK1 or CLK2, connects to the other side of the first capacitor C1. The gate of the second transistor M2 also connects to the output node of each stage.

The third transistor M3 of each stage is diode-connected, having its channel between the supply voltage Vdd and the output node of each stage and is present to maintain the voltage at the output of each stage at least the supply voltage Vdd. Preferably, the four clocks, CLK1, CLK2_a, CLK2, and CLK1_a have the relationship shown in FIG. 2B, i.e., CLK1 and CLK2 are inversions of each other, CLK1_a is in-phase with CLK1 but has a smaller duty cycle and CLK2_a is in-phase with CLK2 but has a smaller duty cycle. Clocks CLK1_a and CLK2_a operate to turn on the pass transistor devices M1 of each stage, and clocks CLK1 and CLK2 operate to boost the voltage at the output of the stage.

When the CLK2_a 78 is high, voltage (in this case Vdd) on the input node 84 is transferred to the output node 86 of the stage 52 via the channel of transistor M1 58, because the channel of transistor M1 58 is conductive due to the change in CLK2_a 78 propagating through capacitor C2 70. When the CLK1 76 transitions high, transistor M2 56 turns on, transferring input voltage Vdd to the gate of transistor M1 58 and boosting, via capacitor C1 68, the output node of the stage to approximately 2Vdd. A short time after CLK1 transitions high, CLK1_a turns on and transfers the 2Vdd voltage to the output of the second stage. Next, when CLK2 transitions high, the output of the second stage is boosted to 3Vdd. A short time after CLK2 transitions high, CLK2_a turns on and the cycle begins anew.

The clocks, CLK2 and CLK1_a, of the second stage must operate out-of-phase from the clocks, CLK1 and CLK2_a, of the first stage, as shown in FIG. 2B, such that the output node of the first stage is boosted prior to the output node the second stage being boosted. Otherwise, the output nodes of two adjacent stages would be connected at the same time, thus defeating the second of the two adjacent stages. Instead, by inversely phasing the clocks between stages, every other stage is a boosting stage.

The result of this implementation is that each stage increases the voltage by an amount approximately equal to Vdd. However, although the circuit of FIG. 2 substantially removes the Vt drop from each stage, four clocks are required between two stages for the circuit of FIG. 2 to work. These clocks, as explained above, must have precise timing relationships to guarantee that the transistors of each stage are not on at the same time, and that the boost time in the previous stage, is properly overlapped with the transfer time, by the adjacent succeeding stage. Furthermore, the four clocks of the circuit of FIG. 2, have high power consumption and the sizes of the pass transistors 58, 62 and the pump capacitors 68, 72 are large, thus requiring large amounts of die area.

It is apparent from the above, that there is a need for an improved charge pump circuit that does not have a significant voltage loss at each stage and has low power consumption. There is also a need for a further improved charge pump that does not require four precisely-timed clocks to operate and does not require large capacitors and transistors.

BRIEF SUMMARY OF THE INVENTION

The present invention is directed towards such a need. A device in accordance with the present invention includes a charge pump system having a first charge pump means and a second charge pump means. The first means includes an input and an output node and is configured to transmit, without substantial loss, an input voltage on the input node to the output node during a first phase of a first clock, and to add a first predetermined voltage to the voltage on the output node during a second phase of a first clock. The second means includes an input and an output node, the input node being connected to the output node of the first means, and is configured to transmit without ubstantial loss, a voltage on the input node to the output node during a first phase of a second clock, and to add a second predetermined voltage to an output node during a second phase of the second clock. The first phase of the first clock is aligned with the second phase of the second clock and the second phase of the first clock is aligned with the first phase of the second clock, such that the voltage at the output of the second means is substantially near the sum of the input voltage and the first predetermined and second predetermined voltages during the second phase of the second clock.

More particularly and in accordance with the present invention, a charge pump cell includes a pass transistor, a biasing transistor and a blocking transistor. The pass transistor its channel connected between an input node and an output node of the charge pump cell. The biasing transistor has its channel connected between the gate of the pass transistor and a biasing node and the blocking transistor has its channel connected between the gate of the pass transistor and the output node of the cell. The gate of the blocking transistor is connected to the gate of the biasing transistor and the input node of the cell. When a voltage at the input node of the cell is greater than a voltage at the output node and a voltage on the biasing node is at least a threshold voltage below the voltage at the input node, the pass transistor passes current from the input node to the output node, and when the voltage at the output node is greater than the voltage at the input node, the pass transistor is non-conductive.

One advantage of the present invention is that, in one embodiment, only two clocks are needed to control the charge pump stage while the stage provides a doubling of the input voltage without the loss of a threshold drop.

Another advantage in the above embodiment is that the two clocks provide the power to operate the charge pump circuitry. No connection of the charge pump stage to the power supply is made.

Yet another advantage of the above embodiment is that low power is achieved by providing the clocks that power the charge pump stage from clock circuitry that recycles the clock energy.

Another advantage of the present invention is that, in another embodiment, lower power operation is obtained by providing the clocks from a pair of clock circuitry blocks.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 3:
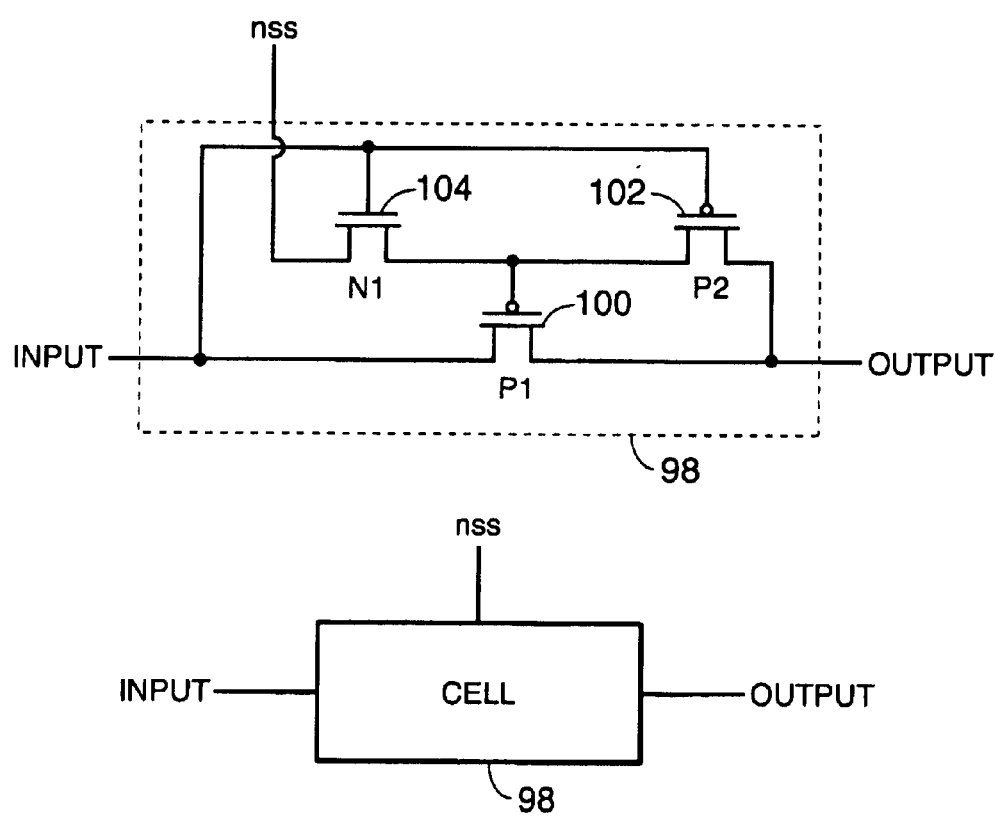
FIG. 3 shows a charge pump cell of the present invention.

FIG. 3 shows a charge-pump cell 98 of the present invention. This charge pump cell 98 has the property that it passes current from input to output depending on the relative magnitudes of the input and output voltages, with very little voltage drop across the cell 98, thus approximating an ideal voltage-controlled switch.

The cell 98 includes two PMOS transistors P1, P2 and one NMOS 104 transistor N1. The first PMOS transistor P1 100 acts as a pass transistor and the second PMOS transistor P2 102 is connected to prevent conduction from the output back to the input. The NMOS transistor is connected to properly bias the gate of the pass transistor P1 when current flows from input to output. More particularly, the first PMOS transistor P1 has a channel connected between the input and the output nodes of the cell. The second PMOS transistor P2 has a channel connected between the output node of the cell and the gate of the first PMOS transistor. The NMOS transistor has a channel connected between the gate of the first PMOS transistor and the NSS node. Both the gate of the second PMOS transistor P2 and the gate of the NMOS transistor N1 are connected to the input node of the cell.

There are two conditions to consider in the operation of the cell. A first condition occurs when the voltage on the input node of the cell is substantially greater than the voltage on the output node of the cell. A second condition is when the voltage on output node of the cell is substantially greater than the voltage on the input node.

When the first condition is present, the pass transistor P1 and the NMOS transistor N1 are both on, and the P2 transistor is off. The NMOS transistor is on because it is assumed that there is a positive voltage between the gate and NSS node of the transistor when the first condition is present. Positive gate drive on the NMOS transistor is guaranteed by the connections made to the NSS node when a plurality of cells are joined as described below. Because the NMOS transistor N1 is on, the pass transistor P1 is also on, because there is a positive voltage between the input node of the cell and the gate of the pass transistor. Thus, the pass transistor conducts from the input node to the output node of the cell, with a very small voltage drop. Also, transistor P2 is off when the NMOS transistor is on, because both sides of the channel of transistor P2 are at a lower voltage than the gate of transistor P2. With the pass transistor on, the output node eventually rises to the voltage level of the input node. When this occurs, condition one is no longer present, and the cell is at the verge of the second condition.

When the second condition is present, both the pass transistor P1 and the NMOS transistor N1 are off, and the second PMOS transistor P2 is on. The NMOS transistor N1 is off because the voltage on the NSS node is no longer at least a threshold voltage below the voltage on gate of the N1 transistor. Transistor P2 is on because the output voltage of the cell is greater than the input voltage of the cell, thus providing a positive voltage between one side of the channel (connected to the output node) and the gate of transistor P2. Pass transistor P1 is off because transistor P2 is on preventing the gate from falling at least a threshold voltage below either side of the channel of transistor P1. Thus, in the second condition, the cell is non-conducting. The cell, therefore, operates as a voltage-controlled switch with little or no voltage drop when on.

Figure 4:
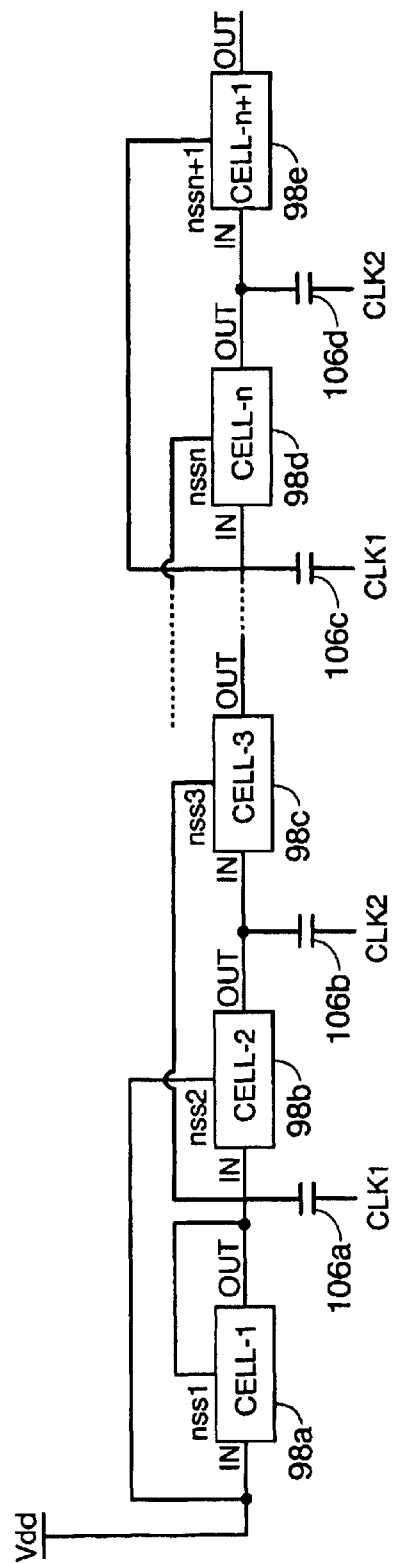
FIG. 4 shows a charge pump system employing the cells of the present invention.

FIG. 4 shows a charge pump system employing the cells of the present invention. It is important to note the connections made to the NSS node. In particular, each NSS node is connected to the input node of the preceding cell, except for cell 1, which has its NSS node connected to the output node of cell 1. Thus, the NSS of cell 2 is connected to the input node of cell 1, the NSS of cell 3 is connected to the input node of cell 2. These connections guarantee that the voltage on the NSS node of a cell is always less than the gate of the NMOS transistor in the cell when the cell should be conducting. Also, the output node of each cell is connected via a capacitor to either a first clock CLK1 or a second clock CLK2, in alternating fashion and the input of the first cell is connected to Vdd. The first and second clocks are non-overlapping clocks similar to CLK1 and CLK1a of FIG. 2, and each has a high voltage level that is very close to Vdd and a low voltage that is very close to VSS.

The charge pump system of FIG. 4 operates as follows. While the first clock CLK1 is low, cell 1 conducts because the first condition is true for cell 1 98a. This causes the voltage on the output node of the cell to become close to $V_{dd}$. When the first clock CLK1 transitions high, cell 1 blocks, because the second condition is now true for the cell, and a charge close to 2Vdd is now present on the output of cell 1. When the first clock CLK 1 is high, the second clock CLK2 is low, so now cell 2 is conducting and a voltage 2Vdd is transferred to the output of cell 2. When CLK 1 transitions low, the second clock CLK2 become high and now the output of cell 2 has 3Vdd.

It is now easy to see that when CLK 1 is low, every other cell, beginning with cell 1, is conducting while the intervening cells are blocking. When CLK is high the situation reverses. The result is that, after at least as many clocks cycles as there are cells, the output of each cell is boosted by an additional voltage Vdd. Thus, the output of the last cell is very close to $N_{cell} \cdot V_{dd}$, where $N_{cell}$ is the number of cells.

Figure 5:
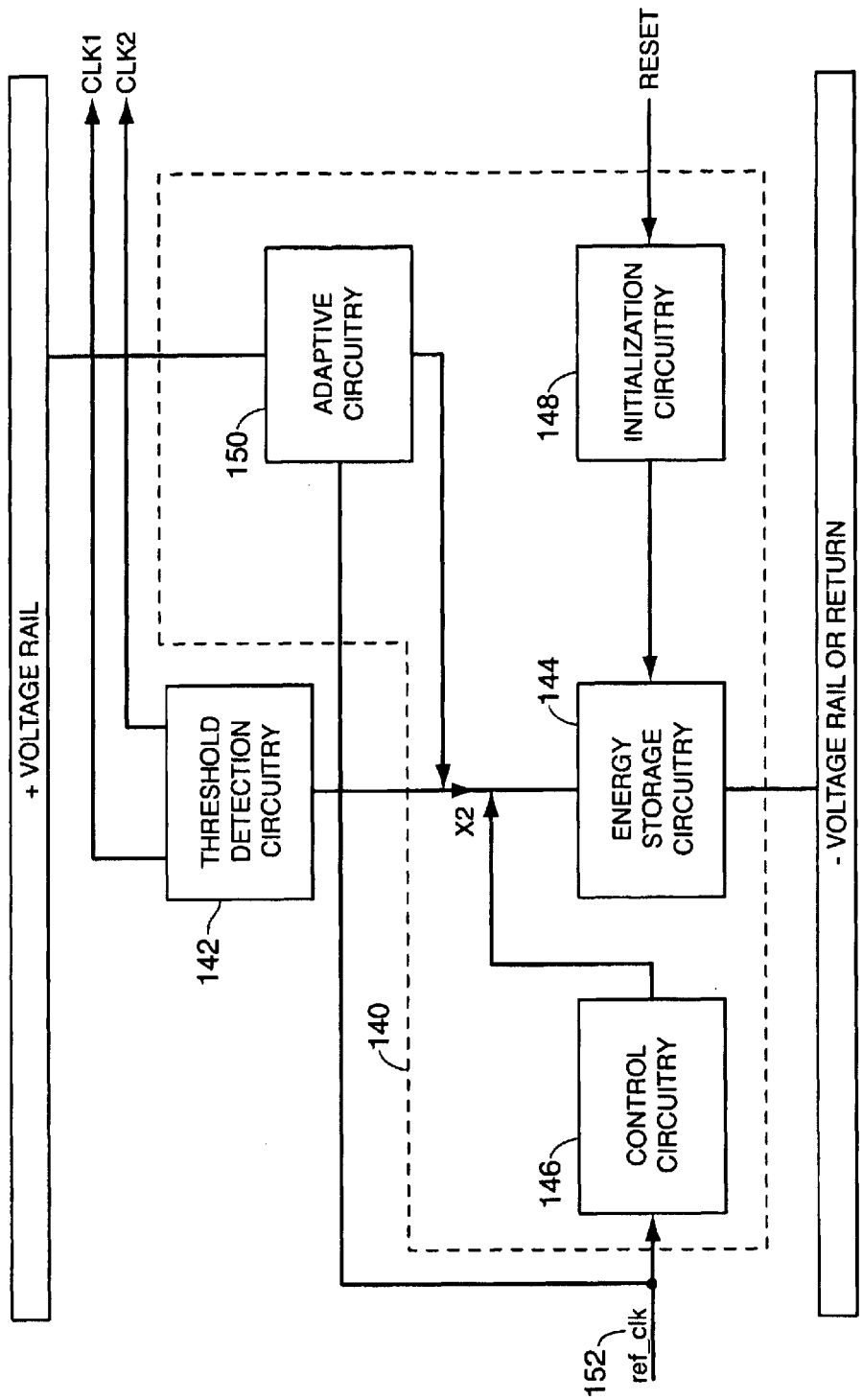
FIG. 5 shows clock circuitry 140 for use with the charge pump of FIG. 3 and charge pump system of FIG. 4.

FIG. 5 shows clock circuitry 140 for use with the charge pump of FIG. 3 and charge pump system of FIG. 4. Clock circuitry 140 and threshold detection circuitry 142 are used to provide the non-overlapping first and second clocks CLK1 CLK2. The clock circuitry 140 includes energy storage circuitry 144, control circuitry 146, initialization circuitry 148 and adaptive circuitry 150. The energy storage circuitry 144, after initialization, provides an oscillating power source on node X2 at a frequency determined by the either the control circuitry 146 or the adaptive circuitry 150, one of which receives a reference clock 152 having a known frequency. The adaptive circuitry 150 maintains the amplitude of the oscillations, by transferring energy from the power supply (+Voltage Rail, −Voltage Rail) to the energy storage circuitry 144 to make up for dissipative losses in the clock circuitry and the circuitry that operates from the energy provided by the clocks.

Figure 6:
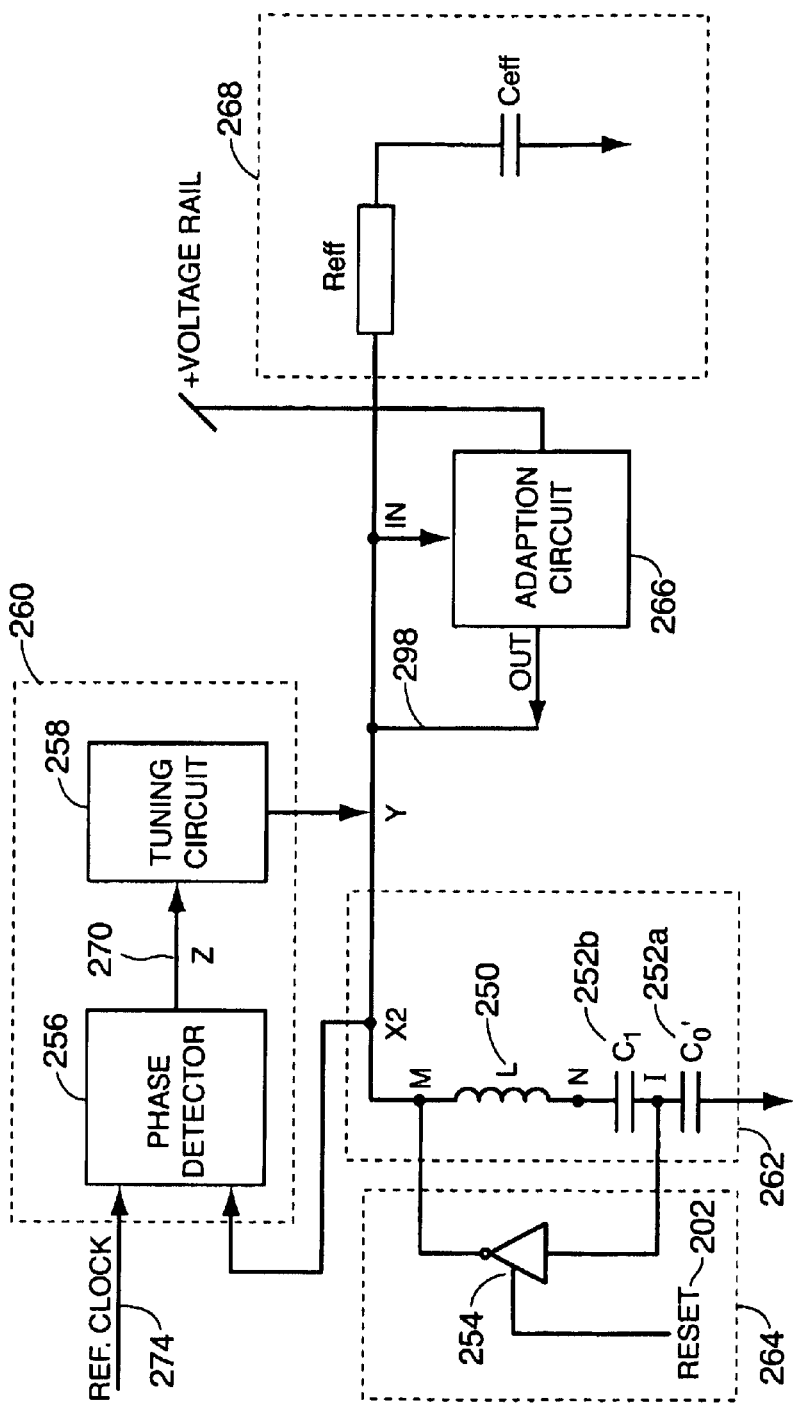
FIG. 6 shows a preferred embodiment of the clock circuitry of FIG. 5.
Figure 7:
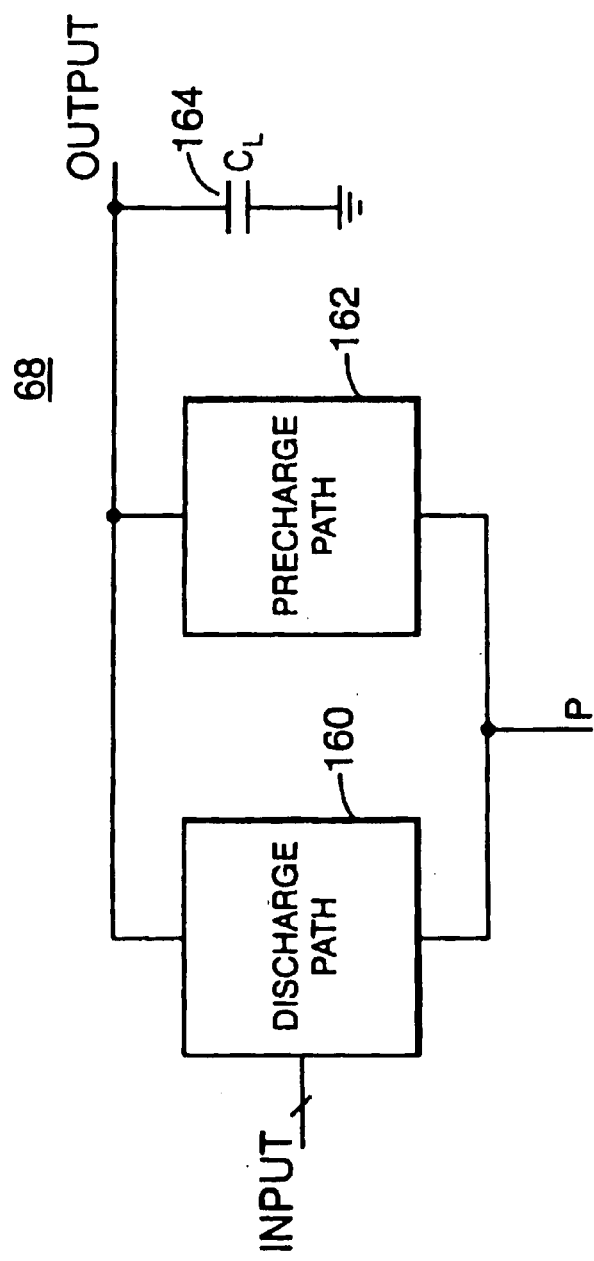
FIG. 7 is a block diagram of the precharge and discharge paths.

An embodiment of the clock circuitry 140 is shown in FIG. 6. The initialization circuitry 264 connects to the energy storage circuitry 262 to initialize oscillations in the energy storage circuitry 262. The control circuitry 260, which includes a phase detector 256 and a tuning circuit 258, connects to the output node X2 of the energy storage circuitry 262 and to a reference clock 274 to control the frequency of the oscillations in the energy storage circuitry 262. The adaptive circuitry 266 also connects to the output X2 of the energy storage circuitry 262 along with the effective circuit model of the logic circuitry 268. The effective circuit model may include discharge path 160 and precharge path 162 of FIG. 7. Paths of any circuitry are modeled as an equivalent series RC circuit, with the equivalent Reff representing the dissipative portion of circuitry 68 and Ceff representing the capacitive portion of circuitry 68 including load capacitance.

In the energy storage circuitry 262, there are two capacitors Co' 252a and C1 252b, where C1 is much smaller than Co'. The junction I between the two provides a point of control for the initialization circuitry 264.

The initialization circuitry 264 includes an inverter circuit 254 that is connected to the output of the energy storage circuitry 262 and the junction I of the C1 252b and Co' 252a capacitances. A reset line 202 controls whether the inverter 254 has a high-impedance output or a low impedance output, which is the inversion of the input. When the reset line 202 is active, the inverter 254 is in the low impedance output state, which causes the energy storage circuit 262 to oscillate. When the reset line 202 is deactivated, the inverter 254 changes to a high-impedance output and the resonant circuit continues to oscillate on its own with a frequency that is controlled by C1, Co', Ceff and the output, Cx, of the tuning circuit.

As mentioned above, the control circuitry 260 includes a phase detector 256 and a tuning circuit 258 that together cause the frequency of the energy storage circuitry oscillations to be equal to the reference clock 274. Phase detector 256 receives the reference clock 274 and the output X2 of the energy storage circuitry 262, compares the two to control the tuning circuit 258 that modifies the frequency of the energy storage circuitry 262 to be the same as frequency of the reference clock 274.

Adaptive circuitry 266 is also connected to the output X2 of the energy storage circuitry 262 to replenish energy that is dissipated in the logic circuitry 268, modeled as an effective resistance Reff and effective capacitance Ceff.

In operation, the energy storage circuitry 262 begins oscillating at its natural resonant frequency after the deactivation of the reset line 202. The natural resonant frequency is related inversely to the square root of the product of L and the value of (Co'‖ C1‖Ceff), where 'x‖y' is defined as the quantity xy/(x+y). If C1' is much smaller than the other capacitances, then it is the capacitance that influences the natural resonant frequency the most (because (Co'‖ C1‖Ceff) is approximately equal to C1'). Once started, the energy storage circuitry is then locked to the reference clock input by the phase detector 256 and tuning circuit 258. The phase detector 256 detects a phase difference between the energy storage circuitry frequency and the reference clock and converts this difference into a signal Z that controls the tuning circuit 258. The tuning circuit 258 then alters the oscillation frequency of the energy storage circuitry 262 by adding either inductance or capacitance into the energy storage circuitry 262 so as to drive the phase difference towards zero. If the amplitude of the oscillations of the energy storage circuit begin to diminish in amplitude, then adaptive circuitry 266 is activated to provide a synchronous energy boost to the oscillations, thereby restoring the amplitude.

The clock circuitry 140 uses very little power because power provided by the clock circuitry to circuitry external to it is returned back to the clock circuitry to once again be supplied by the clock circuitry. In other words, a substantial portion of the energy that the clock circuitry provides is recycled back to the clock circuitry. This means that the power supply need only supply the dissipative losses of the clock circuitry and the external circuitry.

Figure 1:
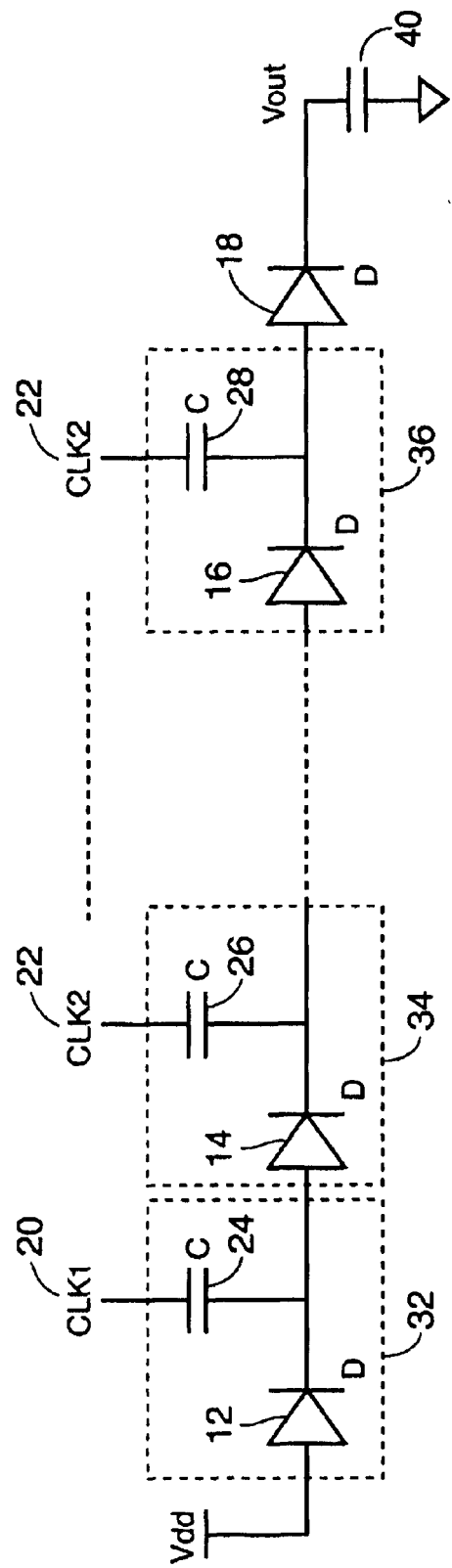
FIG. 1 shows a prior art charge pump employing diodes and two clocks.
Figure 2A:
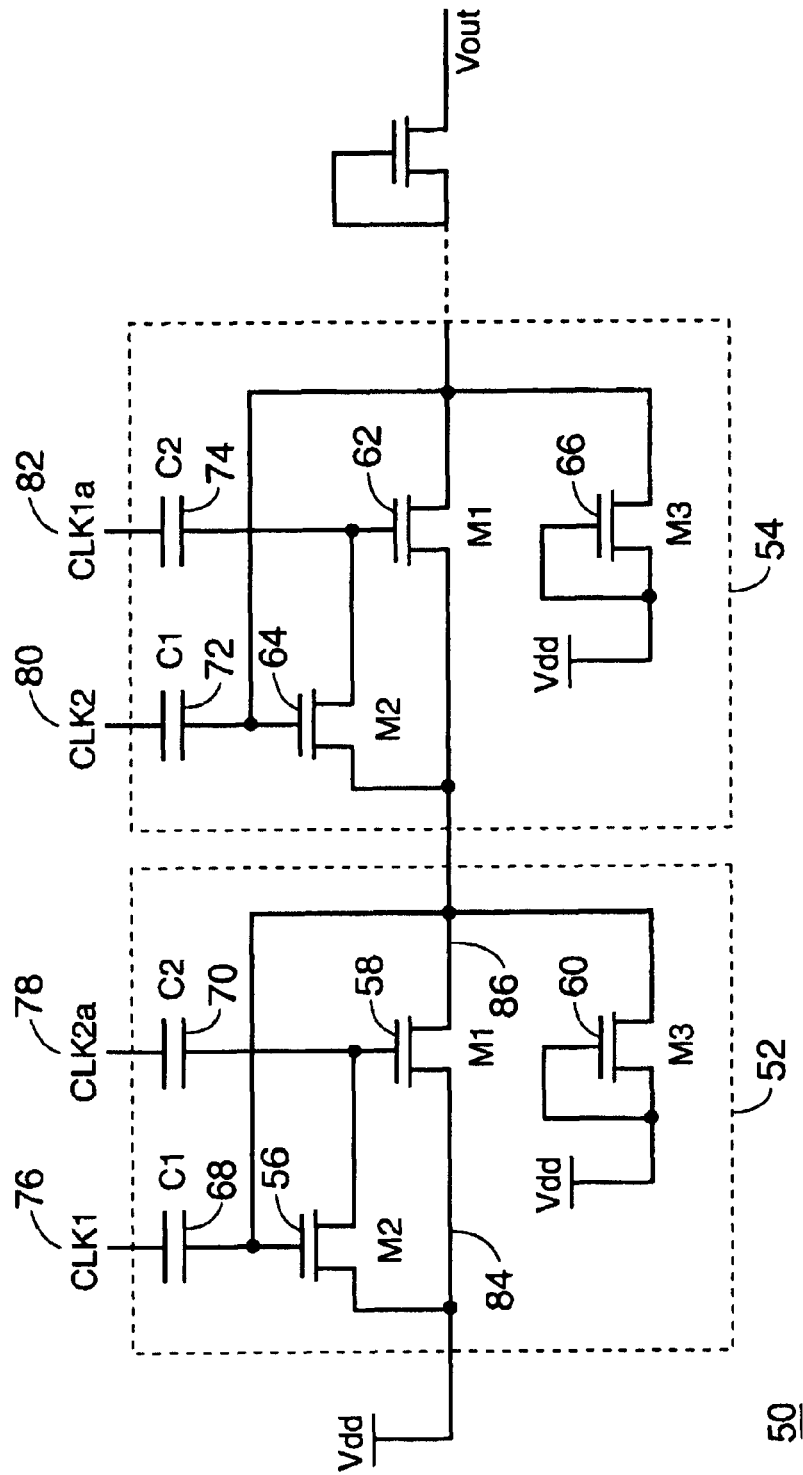
FIG. 2A shows a prior art charge pump employing transistors and four clocks.
Figure 2B:
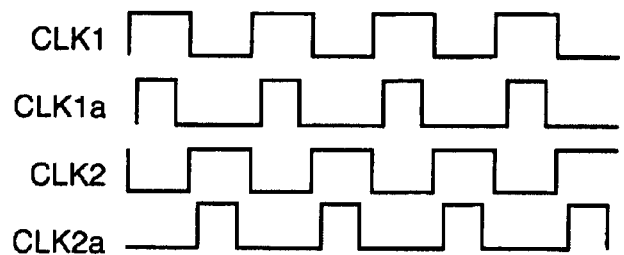
FIG. 2B shows a timing diagram of the operation of the charge pump of FIG. 2A.

Clock circuitry 140 can also be used to reduce the power dissipated by the charge pump circuit 50 of FIG. 2. The circuit 50 is modified to receive the four clocks from two clock circuitry blocks 140. One clock circuitry block provides CLK1 and CLK1_a, and the other clock circuitry block provides CLK2 and CLK2_a. Threshold detection circuitry, connected to the clock circuitry, determines the phases and degree of overlap of the four clocks.

Although the present invention has been described in considerable detail with reference to certain preferred versions thereof, other versions are possible. Therefore, the spirit and scope of the appended claims should not be limited to the description of the preferred versions contained herein.

What is claimed is:

1. A charge pump system comprising:
   first means, including an input and output node, for transmitting, without substantial loss, an input voltage on the input node to the output node during a first phase of a first clock, and for adding a first predetermined voltage to the voltage on the output nodes during a second phase of the first clock; and
   second means, including an input and output node, the input node being connected to the output node of the first means, for transmitting, without substantial loss, a voltage on the input node to the output node during a first phase of a second clock, and for adding a second predetermined voltage to an output node during a second phase of the second clock, the first phase of the first clock being aligned with the second phase of the second clock and the second phase of the first clock being aligned with the first phase of the second clock, such that the voltage at the output of the second means is substantially near the sum of the input voltage and the first predetermined and second predetermined voltages during the second phase of the second clock.

2. A charge pump system as recited in claim 1, wherein the first and second predetermined voltages are the same, and the voltage at the output node of the second means is twice the predetermined voltage.

3. A charge pump system as recited in claim 1, wherein the predetermined voltage is the supply voltage.

4. A charge pump system as recited in claim 1, further comprising clock generation means for generating the first and second clocks.

5. A charge pump cell comprising:
   a pass transistor having a gate, and a p-type channel between a source region and a drain region of the transistor, the channel of the pass-transistor being connected between an input node and an output node of the charge pump cell;
   a biasing transistor having a gate, and an n-type channel between a source region and a drain region of the transistor, the channel of the biasing transistor being connected between the gate of the pass transistor and a biasing node;
   a blocking transistor, having a gate, and a p-type channel between a source region and a drain region of the transistor, the channel of the blocking transistor being connected between the gate of the pass transistor and the output node of the cell, the gate of the blocking transistor being connected to the gate of the biasing transistor and the input node of the cell;
   wherein, when a voltage at the input node is greater than a voltage at the output node and a voltage on the biasing node is at least a threshold voltage below the voltage at the input node, the pass transistor passes current from the input node to the output node, and when the voltage at the output node is greater than the voltage at the input node, the pass transistor is non-conductive.

6. A charge pump system comprising:
   a first charge pump cell, as recited in claim 5, having the input node connected to a first supply voltage and the biasing node connected to an output node; and
   a first capacitor connected between a first clock and the output node of the first charge pump cell, the first clock switching between a first phase and a second phase;
   a second charge pump cell, as recited in claim 5, having the input node connected to the output node of the first charge pump cell, the biasing node connected to the input of the first charge pump cell; and
   a second capacitor connected between a second clock and the output node of the second charge pump cell, the second clock switching between first phase and a second phase;
   wherein, when the first clock switches to a first phase and the second clock switches to a second phase, the first cell is conductive and the second cell is non-conductive, and when the first clock switches to a second phase and the second clock switches to a first phase, the first cell is non-conductive and the second cell is conductive, such that the voltage on the output of the first cell is approximately twice the first supply voltage and the voltage on the output of the second cell is approximately three times the first supply voltage.

7. A charge pump system comprising:
   a first charge pump cell, as recited in claim 5, having the input node connected to an output node of a preceding charge pump cell, the biasing node connected to an input node of the preceding charge pump cell; and
   a first capacitor connected between a first clock and the output node of the first charge pump cell, the first clock switching between a first phase and a second phase;

a second charge pump cell, as recited in claim 5, having the input node connected to the output node of the first charge pump cell, the biasing node connected to the input of the first charge pump cell; and a second capacitor connected between a second clock and the output node of the second charge pump cell, the second clock switching between first phase and a second phase;

wherein, when the first clock switches to a second phase and the second clock switches to a first phase, the first cell is non-conductive and the second cell is conductive and a voltage approximately equal to a supply voltage is added to the voltage at the output of the first cell and voltage on the output of the first cell is transmitted to the output of the second cell, and when the first clock switches to a first phase and the second clock switches to a second phase, the first cell is conductive and the second cell is non-conductive, and a voltage approximately equal to a supply voltage is added to the voltage at the output of the second cell.

8. A charge pump system as recited in claim 7, further comprising a clock generator for generating the first and second clocks.

9. A charge pump system as recited in claim 8, wherein the clock generator includes:

clock circuitry configured to provide an oscillating power signal; and threshold detection circuitry configured to generate first and second clocks for the first and second charge pump cells in response to the oscillating power signal.

10. A charge pump system as recited in claim 9, wherein the clock circuitry includes:

energy storage circuitry for providing a power signal oscillating at a determined frequency;

adaptive circuitry for maintaining the oscillating power signal at a particular power level by providing energy to the energy storage circuitry;

control circuitry for determining the frequency of the power signal oscillations by synchronizing the power signal oscillations to an external reference clock; and initialization circuitry for causing the power signal to start oscillating in response to a reset signal.

11. A method of boosting a voltage above a supply voltage, comprising:

during a first phase, transferring a voltage substantially equal to a supply voltage to an output node of a first cell; and during a second phase, adding a voltage substantially equal to the supply voltage to the voltage on the output node of the first cell, such that after the second phase, the output node of the first cell has a voltage that is two times the supply voltage.

12. A method of boosting a voltage above a supply voltage, comprising:

during a first phase, transferring a voltage substantially equal to a supply voltage to an output node of a first cell; and during a second phase, adding a voltage substantially equal to the supply voltage to the voltage on the output node of the first cell and transferring the total voltage on the output node of the first cell to the output node of the second cell;

during a third phase, adding a voltage substantially equal to the supply voltage to the output node of the second cell, such that after the third phase, the output node of the second cell has a voltage that is three times the supply voltage.

* * * * *